United States Patent [19]

Schrantz

[11] Patent Number: 4,912,053
[45] Date of Patent: Mar. 27, 1990

[54] ION IMPLANTED JFET WITH SELF-ALIGNED SOURCE AND DRAIN

[75] Inventor: Gregory A. Schrantz, Melbourne, Fla.

[73] Assignee: Harris Corporation, Melbourne, Fla.

[21] Appl. No.: 151,184

[22] Filed: Feb. 1, 1988

[51] Int. Cl.⁴ .................. H01L 21/225; H01L 21/265; H01L 29/80

[52] U.S. Cl. ........................................ 437/29; 437/41; 437/56; 437/152; 437/154; 437/160; 437/162; 357/22; 357/42

[58] Field of Search .................. 437/29, 56, 152, 154, 437/30, 41, 200, 160, 162; 357/22

[56] References Cited

U.S. PATENT DOCUMENTS

| | | | |
|---|---|---|---|
| 3,719,535 | 3/1973 | Zoroglu | 357/22 |
| 3,886,582 | 5/1975 | Kobayashi et al. | 357/22 |
| 3,909,318 | 9/1975 | Le Can et al. | 357/50 |
| 4,176,368 | 11/1979 | Compton | 357/22 |
| 4,393,575 | 7/1983 | Dunkley et al. | 437/29 |
| 4,393,578 | 7/1983 | Cady et al. | 357/22 |
| 4,456,918 | 6/1984 | Beasom | 357/22 |
| 4,568,957 | 2/1986 | Zuleeg et al. | 357/22 |
| 4,611,220 | 9/1986 | MacIver | 357/23.7 |
| 4,727,046 | 2/1988 | Tuntasood et al. | 437/54 |

FOREIGN PATENT DOCUMENTS

| | | | |
|---|---|---|---|
| 52-16182 | 2/1977 | Japan | 357/22 |
| 54-23384 | 2/1979 | Japan | 437/29 |
| 54-24269 | 8/1979 | Japan | 357/22 |
| 56-26474 | 3/1981 | Japan | 357/22 |
| 57-23272 | 2/1982 | Japan | 357/22 |
| 57-36863 | 2/1982 | Japan | 437/29 |
| 61-73380 | 4/1986 | Japan | 437/29 |
| WO81/01911 | 7/1981 | PCT Int'l Appl. | 437/29 |

Primary Examiner—Olik Chaudhuri
Attorney, Agent, or Firm—Barnes & Thornburg

[57] ABSTRACT

A method of fabricating I²JFETs including separately and in combination out-diffusion of impurities from doped source and drain contact material to product self-aligned source and drains; using the source and drain contacts as mask to form a self-aligned top gate spaced from the source and drain; and dual ion implantation of the channel for increasing radiation hardness.

22 Claims, 5 Drawing Sheets

4,912,053

ION IMPLANTED JFET WITH SELF-ALIGNED SOURCE AND DRAIN

BACKGROUND AND SUMMARY OF THE INVENTION

The present invention relates generally ion-implanted junction field effect transistors (I²JFET) and more specifically for an improved method of fabricating ion-implanted JFETs with self-aligned sources and drains as well as self-aligned gates for improved radiation tolerances.

The JFETs may be of single conductivity type or complementary. The present technology for adding ion-implanted JFETs (I²JFETs) to a bipolar process requires that the JFET drain and source be formed with the base or emitter diffusion of the bipolar transistor with the channel and top gate being ion implanted therebetween. A typical example is U.S. Pat. No. 4,495,694 to Beasom and 4,596,068 to Peters. Both of these diffusions are optimized toward obtaining the best performance from the bipolar transistors. The performance (i.e. speed) of the I²JFETs is limited by the gate-source capacitance. This capacitance is substantial when the drain and source are formed with the transistor base or emitter diffusion. Since I²JFETs are formed with implanted channel depths of about 0.1-0.2 um and typical emitter diffusions are 1-2 um deep, the drain and source formed from emitter or base diffusions extend far below the JFET channel. This adds to the drain and source to gate capacitance. Gate to source capacitance directly limits the speed of the JFET.

A further-limitation of the present I²JFET/bipolar transistor technology arises from the necessity to align the I²JFET thin oxide to the emitter or base diffusion. The overlap of the thin oxide to emitter or base diffusion limits how small one can reduce the drain and source width. The requirement to maintain a drain and source stripe wide enough to allow for misalignment of thin oxide to the drain and source adds to the capacitance of the drain and source to gate.

Another disadvantage of the present technology which uses the emitter or base diffusion of the bipolar transistors to form the drain and source of the I²JFET is the necessity to make the drain and source stripes wide enough to prevent the contact aperture oxide cut from crossing the drain/source to bottom gate junction. If this misalignment were to occur, the subsequent metal interconnect deposition would short the drain/source to bottom gate as shown in the cross-section of FIG. 1. The requirement to make the drain and source stripes wide enough to prevent the misalignment of contact apertures to drain and source (i.e. base or emitter) adds to the drain and source to gate capacitance of the device.

Present application of ion-implanted JFETs (I²JFETs) in radiation hardened linear circuits requires nominal $V_{pinchoff}$ of 1.0-1.5 V, and $BV_{DSS}$ of 20-40 V. Resistance to neutron and total dose gamma radiation requires thin channels and high carrier concentrations in the channel and top gate. In the present I²JFET technology, $BV_{DSS}$ is limited by the top gate/drain-source junction gradient as discussed in U.S. Pat. No. 4,683,485. Increasing top gate concentration and channel concentration to improve neutron and total dose gamma hardness sacrifices $BV_{DSS}$. The large junction area of the drain-source/bottom gate junction in the current technology I²JFETs contributes to excessive post-radiation leakage currents.

It is an object of the present invention to improve the speed and reduce the size of I²JFETs by eliminating the emitter or base diffusion of the source drain.

Another object of the present invention is to form the source and drain so as to just contact the implanted channel for minimizing the drain and source capacitance to the gate.

Still a further object of the present invention is to provide a method of forming I²JFETs wherein the source and drains are formed concurrent with the activation of the ion implanted top gate and channel to optimize the process control and simplicity.

An even further object of the present invention is to provide a method of fabricating I²JFETs wherein the source and drains are self aligned to the contact thereby improving speed and reducing size.

Still a further object of the present invention is to provide a radiation hard linear device without sacrificing the source to drain breakdown voltage.

An even further object of the present invention is to provide a method of fabricating complementary I²JFETs which are radiation tolerant or hardened devices.

These and other objects of the invention are obtained by the following techniques. The improvement in speed and reduction in size of the I²JFETs results from eliminating the use of emitter or base diffusions for forming the source and drain regions. The source and drain regions according to the present invention are formed by out-diffusion from a contact material, for example deposited polycrystalline silicon which includes the appropriate doping impurities. The structure is heated to diffuse the impurities from the contact material into the substrate to form self-aligned source and drains and source and drain contacts. The self-alignment feature of the contacts to the source and drain permits the source and drain stripe width to be reduced to that of a single oxide cut width. This area reduction decreases drain and source to gate capacitance and shrinks the device size drastically. Thus the JFET's speed and device packing density are both improved.

The out-diffusion to form the source and drain can be performed at the same time as the activation of the ion-implanted top gate and channel implants so as to optimize process control and simplicity. The out-diffusion of the impurities from the contacts are limited such as to just engage the channel, thereby minimizing the source and drain capacitance to gate. For the simplicity of method, the ion implantation for the top gate and channel are performed prior to heating. The ion implantation of the top gate and channel may take place before or after depositing of the contact material. As an alternative, the contact material may be deposited and heated for out-diffusion before the ion implantation for the top gate and channel. This will require a second heating step to activate the ion implanted top gate and channel impurities.

As a further alternative, the ion-implantation for the channel region may be performed first followed by the formation of the source and drain contact material. The top gate is then formed using the source and drain contact material as the alignment mask. Upon heat treating to activate the ion implanted impurities and out-diffuse the source and drains from the source and drain contact material, the ultimately formed source and drain are spaced laterally from the top gate. This produces self-aligned top gate in addition to the self-aligned source and drains. The resulting source and drain regions are made with shallower junctions than the prior art and thereby reduce the junction area. This decreases the radiation induced leakage current. The separation of the source and drain heavily doped regions from the top gate region permits increased channel and top gate concentration for better radiation tolerance without sacrificing $BV_{DSS}$.

As an alternative to the out-diffusion of the source and drain material from the source and drain contact, the self-aligned gate technique may also be used by ion-implanting the source and drain regions. This is followed by forming the source and drain contact material and using it as a mask to perform the ion implantation of the self-aligned gate which will be spaced from the source and drain contact regions upon activation of the ion-implanted impurities.

To further increase the radiation hardness of the device in the self-aligned gate technique, a dual channel implant may be performed. Channel impurities are introduced to a first depth of first impurities concentration to form the active channel region. A second ion-implantation of channel impurities at a second depth and second impurity concentration less than the first depth and first concentration is performed to enhance the channel region at the surface space between the source and drain top gate regions. This allows for maximum active channel doping for neutron hardness and independent control of the channel surface doping for optimum balance of total dose gamma hardening versus $BV_{DSS}$. The ion implantation to form an enhanced channel region is conducted through a thin oxide layer so as to have a peak concentration at the interface of the substrate and this thin oxide layer.

The above techniques may be used in a process to form complementary junction field effect transistors with appropriate masking provided to sequentially form corresponding portions of the complementary JFETs. Preferably the process includes the self-aligned gate technique with the double implanted channel region for each of the complementary JFETs. The complementary process using the self-aligned source and drains as being out-diffused from the contact material would include the additional steps of laying the contact material as a single layer and providing an appropriate mask for the two separate doping steps of the contact material. This reduces the requirements of two different deposition steps for the contact material to be used as an out-diffusion source for the individual sources and drains for the two types of conductory type JFETs.

Other objects, advantages and novel features of the present invention will become apparent from the following detailed description of the invention when considered in conjunction with the accompanying drawings.

DETAILED DESCRIPTION OF THE DRAWINGS

Figure 1:
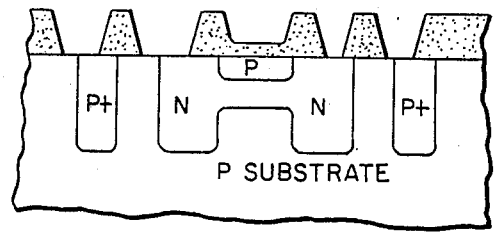
FIG. 1 is a cross section of a prior art JFET illustrating source and drain contact misalignment.
Figure 2:
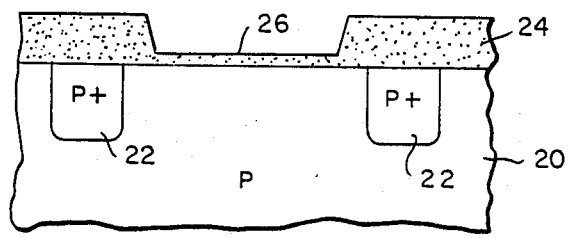
FIGS. 2-4 are cross sectional views of a JFET at different stages of fabrication illustrating a first embodiment of a self-aligned source and drain configuration.

A method for fabricating self-aligned source and drains will be described with respect to FIGS. 2-4. Although the fabrication will be described with respect to an N channel device, the same is also applicable to P channel devices. A P-type substrate 20 has a P+ top gate to bottom gate contact region 22 formed therein simultaneously with emitter formation of a PNP transistor. The gate contact region 22 is a closed curve of generally rectangular shape. Openings are provided in thick field oxide 24 and thin oxide region 26 is formed therein. The resulting structure is illustrated in FIG. 2.

Channel region 28 and top gate region 30 are formed by successive ion implantation steps using for example arsenic and boron respectively. The source and drain contact aperture 32 and 34 are cut in the thin oxide 26 exposing the top gate 30 and adjacent portions of the substrate 20. These apertures cut across the boundary between the thin oxide layer 26 and the field oxide layer 24 to minimize a drain to top gate gated-diode effect. The resulting structure is illustrated in FIG. 3.

For example, the N ion-implant for channel region 28 would be phosphorus at a density of $1 \times 10^{12}$ to $1 \times 10^{13}$ atoms per square cm and at an energy of approximately 100 KeV to 400 KeV. The top gate implant 30 may be for example boron, having a concentration of $5 \times 10^{12}$ to $2 \times 10^{13}$ atoms per square cm and at an energy level of 10 KeV to 100 KeV.

The source and drain contact material is deposited at low temperature. For example, a phosphorus doped LPCVD polycrystalline silicon can be deposited. The total structure is rapidly thermally annealed in neutral environment to form the source and drain contact 40 and 42 to the N channel 28 and to activate the top gate 30 and channel 28 ion implants. The contact material is then patterned into interconnects and source and drain contacts 36 and 38 respectively. The resulting structure is illustrated in FIG. 4.

It should be noted that this is only the process flow for the self-aligned source and drain I²JFET using out diffusion. It may be part of other process flows including the final finishing of other layers of interconnects. Because of the high temperature of annealing activation, it should be conducted after the formation of all other active regions in the integrated circuit. The process flow described starts with the emitter diffusion which forms the top to bottom gate contact region 22.

As discussed previously, the same process flow can be used using different impurity concentrations to form P channel I²JFETs. The substrate may be silicon, gallium arsenide or other appropiate substrates. Although the insulative layers 24 and 26 have been described as oxides, there may be other insulative materials. It can be seen that the self-aligned source and drain method avoids any contact misalignment and also reduces the overall size since additional lateral separation need not be provided to overcompensate for such misalignment.

The out diffusion depth is controlled to optimally contact the implanted N channel region 28 but not to penetrate beneath it. Limiting the out diffusion from the contact material such that it just contacts the channel, minimizes the drain and source capacitance to the gate. The resulting structure is illustrated in FIG. 4 includes the P+ region 22 having impurity concentration of $5 \times 10^{17}$ to $5 \times 10^{19}$ atoms per cubic centemeter and a depth of 1.0 to 2.0 micron. The channel region 28 has an impurity concentration of $5 \times 10^{15}$ to $1 \times 10^{18}$ atoms per cubic centimeter and a thickness of 0.15 to 0.9 micron. The top gate region 30 has an impurity concentration of $5 \times 10^{15}$ to $5 \times 10^{18}$ atoms per cubic centimeter and a depth of 0.03 to 0.4 micron. The source and drain regions 40 and 42 have an impurity concentration of to $1 \times 10^{18}$ to $5 \times 10^{20}$ atoms per cubic centimeter and a depth of 0.15 to 0.9 micron.

If the resistance of the doped contact material 36 and 38 is not low enough, a layer of refractory metal may be deposited, for example tungsten, and heated to form a polysilicide with the doped polycrystalline silicon 36, 38. Alternatively a silicide may be formed by sputter deposition or LPCVD of the refractory metal silicide.

Figure 3:
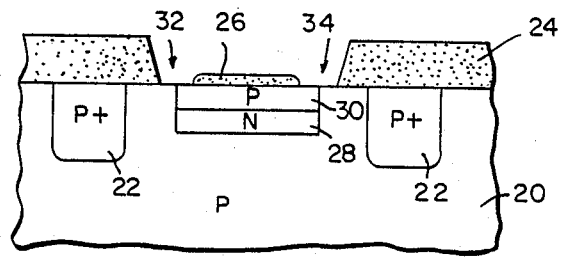
Figure 4:
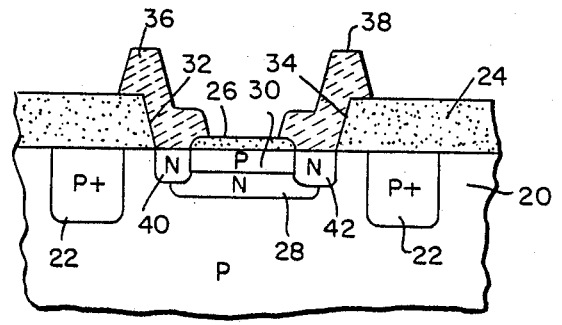
Figure 5:
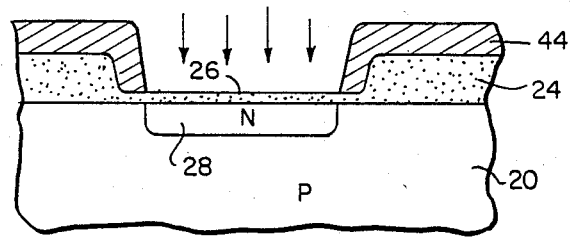
FIGS. 5-7 are cross sectional views of a JFET at different stages of fabrication using the self-aligned gate and self-aligned source and drain technique of the present invention.
Figure 6:
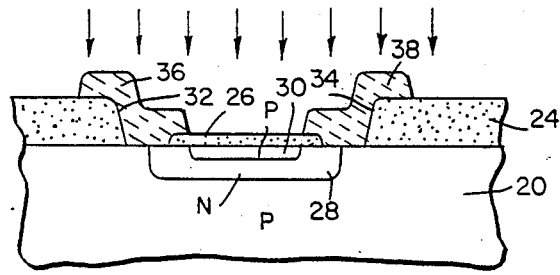
Figure 7:
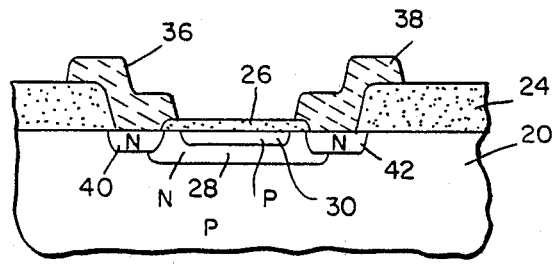

A modification to the process of FIGS. 2-4 is illustrated in FIGS. 5-7. The process is the same up to and including FIG. 2 forming the thin oxide and the top to bottom gate contacts 22 (which have been deleted for the sake of clarity). Those regions having the same function have the same reference number. A mask 44, for example photoresist, is applied to define the channel region. N type impurities, for example arsenic or antimony are ion-implanted to provide the channel region 28 as unactivated channel region impurities 28 as illustrated in FIG. 5.

The mask 44 is removed and the source and drain contact apertures 32 and 34 are formed in the field oxide 24. Doped contact material is applied and patterned to produce source and drain contact regions 36 and 38 extending through the source and drain apertures 32 and 34. P-type impurities, for example boron, are ion-implanted to form the unactivated P-type gate 30 using the contact materials 36 and 38 as an alignment mask. The structure at this state is illustrated in FIG. 6.

A rapid thermal anneal in a neutral environment is conducted to out-diffuse impurities from the source and drain contacts 36 and 38 to form source and drain regions 40 and 42 and simultaneously activate the ion-implanted top gate and channel regions The resulting structure is illustrated in FIG. 7. In comparing the I²J-FET of FIG. 7 to that of FIG. 4, it will be noted that the source and drain regions 40 and 42 are spaced from the top gate region 30. This permits increased channel and top gate concentration for better neutron and total gamma dose tolerance without sacrificing BV$_{DSS}$. As in FIGS. 4 and 7, the shallow source and drain contacts 40 and 42 compared to the depth of the channel 28 decreases the leakage current from neutron effects by reducing the junction area between the source and drain contact and the bottom gate.

Figure 8:
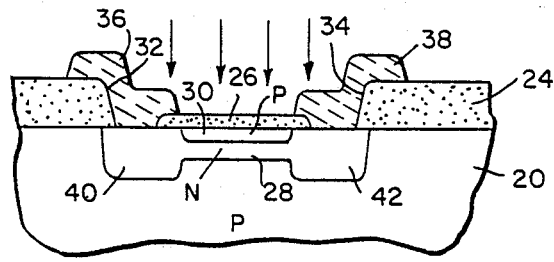
FIG. 8 is a cross sectional view of a JFET having a self-aligned source and drain wherein the top gate and channel are formed after the source and drain are out diffused.

The self-aligned top gate structure provides for optimum control of the top gate to source/drain spacing for breakdown control. This control is produced by simply selecting the etching pattern of the source and drain contacts to produce the appropriate separation taking into account any lateral diffusion occurring during ion-implant activation A further alternative to the previously described processes is described with respect to FIG. 8. After the formation of the thin oxide 26 as illustrated in FIG. 2, the contact apertures 32 and 34 are cut for the source and drain regions in the thin oxide 26. The doped contact material for example a phosphorus doped polycrystalline silicon or a tungsten polycide is deposited and patterned to form the source and drain contact 36 and 38. Rapid thermal anneal is performed in a neutral environment to out-diffuse the impurities from the source and drain contacts 36 and 38 to form source and drain regions 40 and 42.

N and P type impurities, for example boron and phosphorus or boron and arsenic are implanted to form the channel 28 and top gate region 30 using the patterned source and drain contacts 36 and 38 as a mask. A rapid thermal anneal is performed in a neutral environment to activate the ion-implanted impurities for the channel 28 and the top gate 30. The resulting I²JFET of FIG. 8 differs from the previous embodiments in that the source and drain region 40 and 42 are of a greater depth than the channel region 28. Although the top gate 30 and the channel region 28 are both self-aligned in this embodiment, the source and drain regions 40 and 42 are not spaced from the top gate 30 as in FIG. 7.

Figure 9:
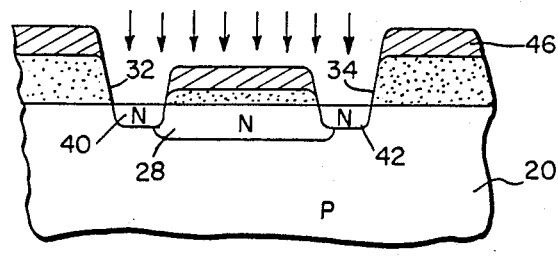
FIG. 9 is a cross sectional view of a JFET showing ion-implantation of the source and drain for use in the self-aligned gate technique or process of FIGS. 5-7.

As an alternative to the out-diffused process of FIGS. 2-8, an ion-implanted source and drain process will be described with respect to FIG. 9. After formation of the thin oxide 26 of FIG. 2 and the ion-implantation of the channel region 28 of FIG. 5, source and drain contact apertures 32 and 34 are formed through a photoresist layer 46. Without removing the photoresist layer 46, N type impurities, for example, arsenic are ion-implanted, for example, at a density of $1 \times 10^{15}$ atoms per cubic centimeter and an energy level of 60 KeV. The device at this stage is illustrated in FIG. 9.

The photoresist 46 is removed and source and drain contact material is applied and patterned so as to be used as a self-aligned top gate mask. P type impurities, for example, boron is implanted at a density of $5 \times 10^{12}$ to $2 \times 10^{13}$ atoms per cubic centimeter and an energy level of 10 KeV to 100 KeV to produce the top gate region 30 as illustrated in FIG. 6. Rapid thermal anneal is applied for the contact material which may be a silicide and to activate all the implants simultaneously. For example, a rapid thermal anneal of approximately 10 seconds at 1000° C. provides a sheet resistance of approximately 1 ohm per square for a titanium silicide of a thickness of source and drain regions is approximately 1500 angstroms with a peak concentration of $10^{20}$ atoms per cubic cm. The thin oxide 26 is approximately 100 to 1500 angstroms.

These fabrications steps can also be performed to form a P channel I²JFET. They would include forming a 100 to 1500 angstrom thin oxide over an N type substrate with an N+ top to bottom gate contact diffusion. The channel implant would be, for example, boron at a density of $1 \times 10^{12}$ to $1 \times 10^{13}$ atoms per cubic centimeter at an energy level of 100 KeV to 300 KeV. The source and drain implant would be boron at a density of $5 \times 10^{15}$ atoms per cubic centimeter and an energy level of 30 KeV. The top gate implant would be phosphorus at a density of $2 \times 10^{12}$ to $2 \times 10^{13}$ atoms per cubic cm and an energy level of 40 KeV to 300 KeV. The rapid thermal annealing of 10 seconds at a 1000° C. would provide a source, drain junction depth of approximately 2000 angstroms and a peak concentration exceeding $10^{20}$ atoms per cubic cm.

Figure 10:
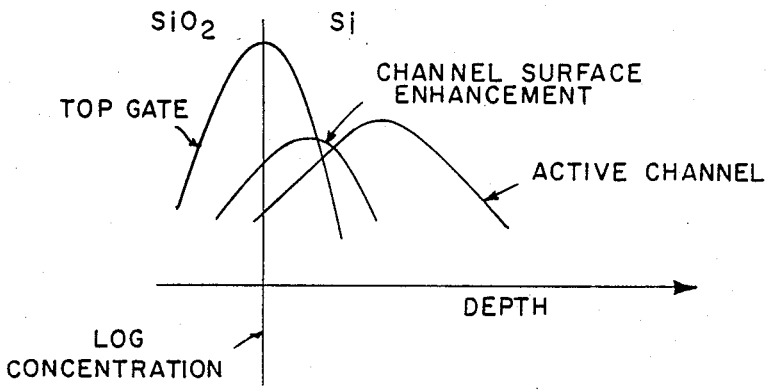
FIGS. 10 and 11 are graphs showing two different distributions of ion impurity concentration for the doubly ion implanted channel region according to the principles of the present invention.
Figure 11:
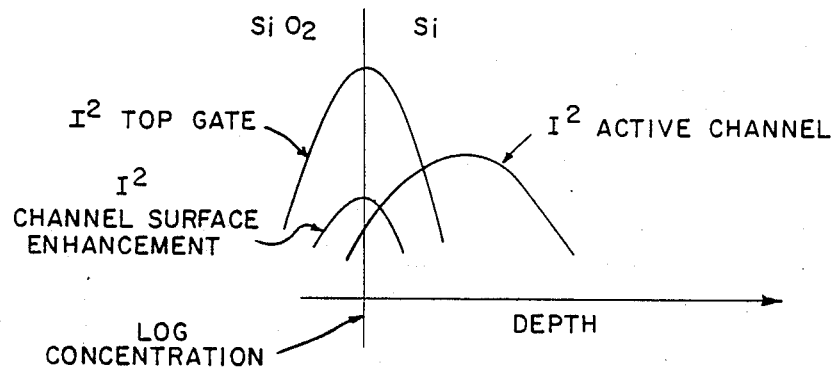

In the I²JFET wherein the source and drain 40 and 42 are spaced from the top gate 30, a portion of the channel 28 is exposed at the surface. To increase total dose hardness of the device, a method is provided for a double channel implant. This allows for maximum active channel doping for neutron hardness and independent control of the channel surface concentration for optimum balance of total dose gamma hardening versus $BV_{DSS}$. As illustrated in FIG. 10, the top gate has an impurity concentration which is maximum at the silicon/silicon dioxide interface. The process would include a first ion implant for the active channel region having a first impurity concentration and a first depth. A second channel implant having a smaller impurity concentration and a shorter depth is then provided. This produces an enhanced surface region between the active channel region and the surface of the substrate. To produce optimum results of the second channel ion implantation, the implant energy is chosen so as to place the peak concentration at the silicon/silicon dioxide interface as illustrated in the graph FIG. 11. Thus the interference of the second implant with the first implant for the active channel profile is minimized and optimum resistance to total dose gamma induced surface inversion is obtained.

The self-aligned gate with the spaced source and drains as well as the double implanted channels will be described for a complementary JFET in FIGS. 12-15. The regions and areas of the N channel device have the same numbers as that in the previous drawings with those of the P channel device having the same reference numbers with the value 100 added. The process begins by forming P regions 20 and N regions 120 for the back gate of the N channel and P channel devices respectively. Thin oxide regions 26 and 126 are formed in the thick field oxide 24. The contacts between the top and bottom gate are performed, but were deleted from the drawings for the sake of clarity. The isolation of the regions 20 and 120 are by any desirable method including junction, dielectric or combination thereof.

Figure 12:
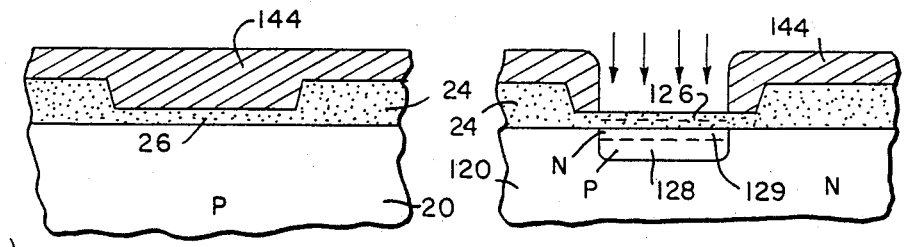
FIGS. 12-15 show complementary JFETs at various stages of fabrication according to the principles of the present invention to form self-aligned gates.

A mask layer 144 is applied and patterned to expose the thin oxide 126 and the area for the P channel implants. As discussed with respect to FIGS. 10 and 11, the P channel implant is performed as a first high impurity, deep implant producing region 128 which is the active channel region and a second lower impurity lower energy implant to enhance the surface resulting in region 129. The region 129 is illustrated by the dashed lines extending into the substrate 120 as well as into the thin oxide layer 126. The resulting structure is illustrated in FIG. 12. The masking photoresist 144 is removed and the same process steps are performed to produce the dual ion implant for the active channel 28 and channel surface enhancement 29 for the N channel device.

Figure 13:
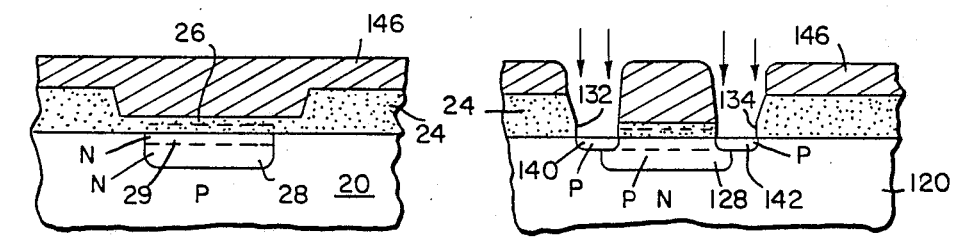

The second photoresist layer is removed and a third photoresist layer 146 is applied. Apertures for the P channel source and drains of 132 and 134 are provided in the masking layer 146 and the thin oxide 126. Ion implantation of P type impurities is performed to form the unactivated ion implanted impurities 140, 142 for the source and drain. The resulting structure is illustrated in FIG. 13. These process steps are then repeated with a new fourth photoresist masking layer to form the source and drain regions to provide apertures in the thin oxide layer 26 and ion implant impurities for the source and drain regions 40 and 42 of the N channel device.

Figure 14:
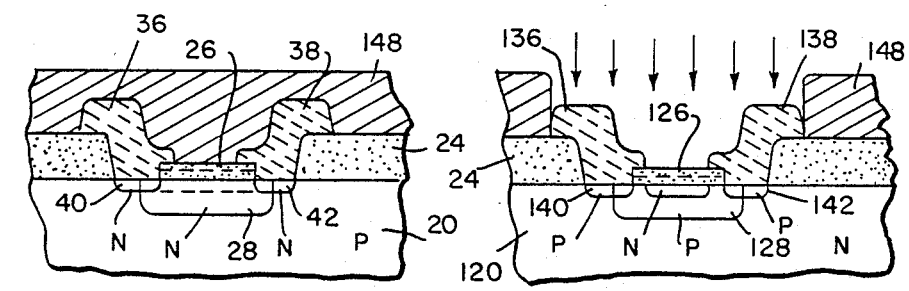
Figure 15:
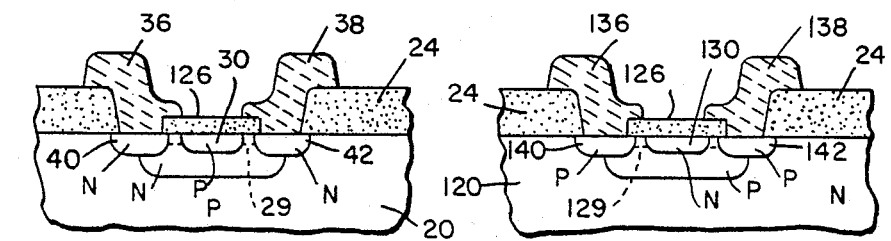

The contact material, for example polysilicon or a silicide, is deposited and patterned, to form the source and drain contact region for source and drain contact materials 36 and 38 for the N channel device and 136 and 138 for the P channel device. The photoresist is stripped and the structure is not heat treated at this point. Next the photoresist layer 148 is applied and patterned to form a mask exposing the P channel device including the source and drain contact materials 136 and 138. N type impurities are ion implanted using the source and drain contacts 136 and 138 as part of the mask with photoresist layer 148. This produces the top gate region 130 spaced from the source and drain implant 140, 142. The resulting structure is illustrated in FIG. 14. The photoresist layer 148 is removed and a new mask layer is formed. P type impurities are ion-implanted to form the P type top gate area 30 self-aligned using the source and drain contact materials 36, 38 as mask. This also results in the top gate 30 being spaced from the source and drain regions 40 and 42. The complete structures are rapidly thermally annealed to anneal the silicide and activate all the ion-implants simultaneously. The resulting structure is illustrated in FIG. 15. The complementary structure includes source and drains laterally separated from the top gate and having a depth less than the channels Also the portion of the channel between the source and drain and the top gate is enhanced by the dual channel ion implantation process.

Figure 16:
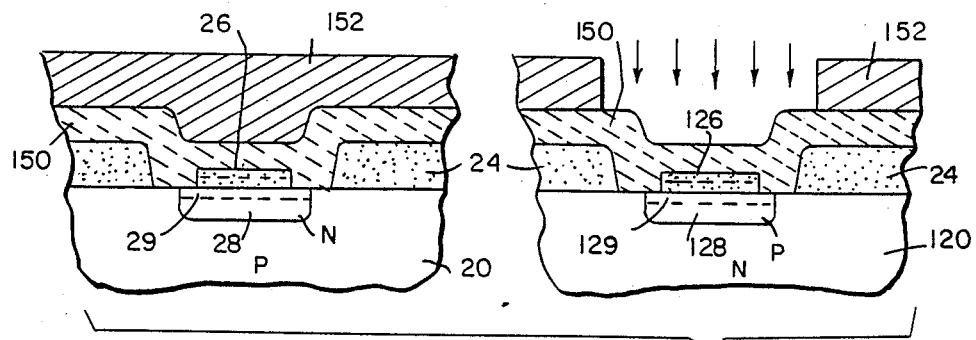
FIGS. 16 and 17 show complementary JFETs at different stages of fabrication to form a self-aligned gate and self-aligned source and drains according to the principles of the present invention.
Figure 17:
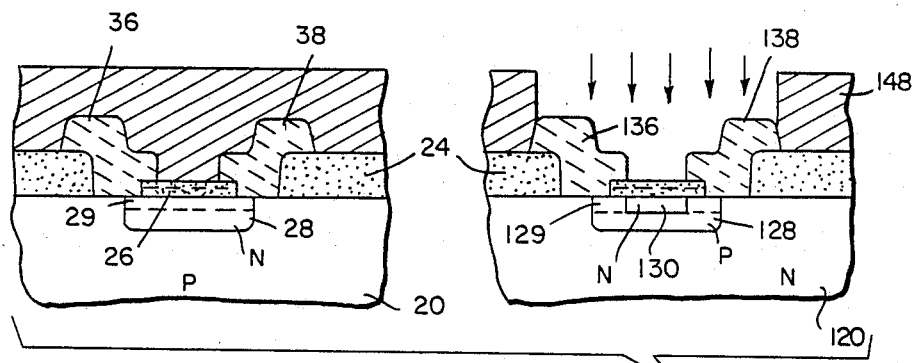

Using the self-aligned source and drain with out-diffusion from the contact material is illustrated in FIGS. 16 and 17. The formation of the thin oxide and the double implant for the channel regions 28 and 128 as described in FIG. 12 are performed. After removal of the photoresist mask 144 and 44 a single mask layer 46, 146 is applied and the contact apertures 32, 34, 132 and 134 are formed for the source and drain regions of both the P and N channel devices simultaneously. This Photoresist layer 46, 146 is removed and a single layer 150 of contact material is applied. Photo resist layer 152 is applied and patterned to expose the total area in which the P channel devices are formed. P type impurities are then ion implanted into the contact material 150 through the exposure in the mask 152. The device at this stage of fabrication is illustrated in FIG. 16. Photo resist layer 152 is removed and another photoresist layer is applied and patterned to expose the contact material 150 over the N channel devices. N type impurities are then ion-implanted into the exposed portion of the contact material 150.

This is followed by masking to form patterns in the doped contact material 150 to form source and drain contacts 36 and 38 and 136 and 138 respectively. As in the step of FIG. 14, a mask material 148 is applied and an opening formed therein to expose the P channel devices. N type impurities are introduced to form the top gate region 130 using the photoresist 148 and the doped contact material source and drains 136 and 138 as masks. This produces the self-aligned gate 130 which will be spaced from the subsequently to be formed self-aligned source and drain regions. This is illustrated in FIG. 17. The process is repeated to form a photoresist mask and ion implant P type impurities for the top gate of the N channel devices to form a self-aligned gate in combination with and spaced from the self-aligned source and drain regions. A rapid thermal anneal is conducted to anneal the silicide or contact material and activate all the ion implanted regions as well as out-diffuse the impurities from the source and drain contacts to form the source and contact regions. The resulting structure would be that of FIG. 15.

The processes of FIG. 1–17 are used to provide an improved I²JFET. The source and drains may be self-aligned to their contact material using an out diffusion process by itself or in combination with a self-aligned gate which uses the source and drain contact as a mask. The contact material may be polycrystalline silicon or silicides thereof if one is using the out-diffusion process to form self-aligned source and drain. Other materials may be used if one is ion implanting the original source and drains as long as it is capable of forming a mask for the self-aligned gate technique. The process described is capable of forming individual JFETs or complementary JFETs.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A method for fabricating junction field effect transistors comprising:
   introducing first and second conductivity type impurities into a first surface of a substrate of said first conductivity type by ion implantation to form a top gate of said first conductivity type and a channel of said second conductivity type between a said substrate, which is a bottom gate, and said top gate;
   depositing contact material including second conductivity type impurities at two spaced positions along said surface of said substrate; and
   heating to simultaneously activate said ion implanted impurities to form said top gate and channel and diffuse said second conductivity type impurities from said contact material into said channel to form source and drain with self-aligned contacts.

2. A method according to claim 1, wherein said depositing step is performed after said introducing step.

3. A method according to claim 2, wherein said depositing step is performed at a low temperature.

4. A method according to claim 1, wherein said introducing step includes first introducing said second conductivity type impurities to form said channel before said depositing step and second introducing said first conductivity type impurities to form said top gate after said depositing step.

5. A method according to claim 4, wherein said second introducing step is performed to form a top gate spaced from said contact material at said surface of said substrate.

6. A method according to claim 5, including selecting said impurities so that said top gate is spaced from said source and drain and said channel is deeper than said source and drain after said heating step.

7. A method according to claim 4, wherein said substrate includes a thick layer of field insulator on a surface; and including:
   the preliminary steps of forming an opening in said field insulator to expose a portion of said substrate in which said subsequent introducing and depositing steps are to be performed;
   forming a thin insulator layer in said opening; and
   forming contact apertures in said thin insulator layer before said depositing step.

8. A method according to claim 7, including patterning said contact material to form a contact portion extending across said thin insulator layer to be used as a mask during said second introducing step to form a top gate spaced from said contact material at said surface of said substrate 9. A method according to claim 1, wherein said depositing includes depositing a doped polycrystalline silicon and a refractory metal to form a polycrystalline silicide.

10. A method according to claim 1, wherein said substrate includes a thick layer of field insulator on a surface; and including:
    the preliminary steps of forming an opening in said field insulator to expose a portion of said substrate in which said subsequent introducing and depositing step are to be performed; and
    forming a thin insulator layer in said opening; and
    forming contact apertures in said thin insulator layer before said depositing step.

11. A method according to claim 1, wherein said depositing step includes patterning said contact material to form contact portions and is performed before said introducing step; and
    said contact portions are used as a mask during said introducing step.

12. A method for fabricating junction field effect transistors comprising:
    introducing a second conductivity type impurities into a first surface of a substrate of a first conductivity type to form a channel of said second conductivity type;
    introducing second conductivity type impurities into said substrate through contact apertures in an insulating layer on said first surface to form spaced source and drains of said second conductivity type in said channel;
    depositing and patterning contact material to form a contact to said substrate through said contact apertures for said source and drain and a portion extending across said insulating layer; and
    introducing first conductivity type impurities into said channel using said contact material as a mask to form a top gate of said first conductivity type in said channel and spaced from said source and drain.

13. A method according to claim 12, wherein all said introducing steps are performed by ion implantation and including heating the substrate subsequent to all said ion implantations to activate said ion implanted impurities to form said top gate, channel, source and drain.

14. A method according to claim 12, wherein introducing said impurities to form said source and drain includes depositing contact material including said second conductivity type impurities; wherein introducing said impurities to form said channel and top gate includes ion implantation; and including heating said substrate subsequent to all introducing steps to diffuse said second conductivity type impurity from said contact material into said channel to form said source and drain and activating said ion implanted impurities to form said top gate and channel.

15. A method of fabricating complementary junction field effect transistors comprising:

(a) selectively introducing impurities of a first conductivity type into a first bottom gate of a second conductivity type to form a first channel of a first conductivity type;

(b) selectively introducing impurities of a second conductivity type into a second bottom gate of a first conductivity type to form a second channel of a second conductivity type;

(c) selectively introducing impurities of a first conductivity type into said first channel to form spaced first source and first drain of said first conductivity type in said first channel;

(d) selectively introducing impurities of a second conductivity type into second channel to form spaced second source and second drain of said second conductivity type in said second channel, (e) selectively introducing impurities of a second conductivity type into said first channel to form a top gate of said second conductivity type in said first channel and spaced from said first source and first drain;

(f) selectively introducing impurities of a first conductivity type into said second channel to form a top gate of said first conductivity type in said second channel and spaced from said second source and second drain;

(g) forming first source and drain contact apertures in a thin insulator layer over said first channel prior to step c;

(h) forming second source and drain contact apertures in a thin insulator layer over said second channel prior to step d; and (i) depositing and patterning a contact material to form source and drain contacts having a portion extending across said thin insulator prior to steps e and f to be used as a mask during steps e and f to form said first and second top gate spaced from a respective source and drain.

16. A method according to claim 15, wherein steps a through f are performed by ion implantation and further including heating to simultaneously activate all ion implanted impurities to form said first and second channels, sources, drains and top gates.

17. A method according to claim 15, wherein:
steps g and h are performed simultaneously prior to steps c and d;
step c includes selectively introducing said first conductivity type impurities into first portions of said contact material in said first source and drain contact apertures;
step d includes selectively introducing said second conductivity type impurities into second portions of said contact material in said second source and drain apertures;
steps a, b, e and f are performed by ion implantation; and
including heating to simultaneously active all ion implanted impurities and diffuse impurities from said contact material into said channels to form said first and second channels, top gates, sources and drains.

18. A method according to claim 15, wherein step e includes forming a mask covering said second channel and exposing said first channel and said first source and drain contacts, and step f includes forming a mask covering said first channel and exposing said second channel and said second source and drain contacts.

19. A method for fabricating junction field effect transistors comprising:
introducing second conductivity type impurities into a first surface of a substrate of a first conductivity type to a first depth and first impurity concentration to form an active channel;
introducing second conductivity type impurities into said substrate to a second depth and second impurity concentration less than said first depth and first impurity concentration to form an enhanced channel region at said surface of said active channel;
introducing second conductivity type impurities into said substrate to form spaced source and drains of said second conductivity type in said active channel and enhanced channel region; and
introducing first conductivity type impurities into said channel to form a top gate of said first conductivity type in said channel and spaced from said source and drain.

20. A method according to claim 19, wherein said introducing steps for forming said channel are performed by ion implantation through a thin insulative layer on said substrate and said introducing step to form said enhanced channel region is performed to have a peak concentration at an interface of said substrate and said insulative layer.

21. A method of fabricating complementary junction field effect transistors comprising:

(a) selectively introducing impurities of a first conductivity type into a first bottom gate of a second conductivity type to a first depth and first impurity concentration to form a first active channel of a first conductivity type;

(b) selectively introducing first conductivity type impurities into said first active channel to a second depth and second impurity concentrations less than said first depth and first impurity concentration to form a first enhanced channel region at the surface of said first active channel;

(c) selectively introducing impurities of second conductivity type into a second bottom gate of a first conductivity type to a third depth and third impurity concentration to form a second active channel of a second conductivity type;

(d) selectively introducing second conductivity type impurities into said second active channel to a fourth depth and fourth impurity concentration less than said third depth and third impurity concentration to form a second enhanced channel region at the surface of said second active channel;

(e) selectively introducing impurities of a first conductivity type into said first active channel and first enhanced channel region to form spaced first source and first drain of said first conductivity type in said first active channel;

(f) selectively introducing impurities of a second conductivity type into said second active channel and second enhanced channel region to form spaced second source and second drain of said second conductivity type in said second active channel;

(g) selectively introducing impurities of a second conductivity type into said first active channel and first enhanced channel region to form a top gate of said second conductivity type in said first active channel and spaced from said first source and first drain at the surface by said first enhanced channel region; and (h) selectively introducing impurities of a first conductivity type into said second active channel and second enhanced channel region to form a top gate of said first conductivity type in said second active channel and spaced from said second source and second drain at the surface by said second enhanced channel region.

22. A method according to claim 21, wherein steps a, b, c and d are performed by ion implantation through a thin insulator layer on said first and second bottom gates and steps b and d are performed to have a peak concentration at an interface of said first bottom gate and said thin insulator layer and at an interface of said second bottom gate and said thin insulator layer, respectively.

* * * * *